(12) United States Patent
Tanaka et al.

(10) Patent No.: US 9,425,805 B2
(45) Date of Patent: Aug. 23, 2016

(54) FREQUENCY DIVIDING CIRCUIT AND PHASE SYNCHRONIZATION CIRCUIT

(71) Applicant: Sony Corporation, Tokyo (JP)

(72) Inventors: Yusuke Tanaka, Tokyo (JP); Kenji Komori, Kanagawa (JP)

(73) Assignee: Sony Corporation, Tokyo (JP)

( * ) Notice: Subject to any disclaimer, the term of this patent is extended or adjusted under 35 U.S.C. 154(b) by 29 days.

(21) Appl. No.: 14/597,639

(22) Filed: Jan. 15, 2015

(65) Prior Publication Data

US 2015/0222270 A1 Aug. 6, 2015

(30) Foreign Application Priority Data

Feb. 4, 2014 (JP) ................................ 2014-019650

(51) Int. Cl.
| | |
|---|---|
| *H03K 21/00* | (2006.01) |
| *H03K 23/00* | (2006.01) |
| *H03K 25/00* | (2006.01) |
| *H03K 21/02* | (2006.01) |
| *H03L 7/18* | (2006.01) |

(52) U.S. Cl.
CPC ............ *H03K 21/026* (2013.01); *H03K 21/023* (2013.01); *H03L 7/18* (2013.01)

(58) Field of Classification Search
USPC ............... 327/2–12, 105–123, 141, 144–163, 327/355–361, 202, 203, 208–212, 218; 331/1 A, 15–17; 375/373–376; 377/47, 377/48
See application file for complete search history.

(56) References Cited

U.S. PATENT DOCUMENTS

| | | | | |
|---|---|---|---|---|
| 6,211,741 B1* | 4/2001 | Dalmia | ................ | H03D 13/004 327/147 |
| 7,560,963 B2* | 7/2009 | Yun | ........................... | H03L 7/07 327/149 |
| 2005/0123087 A1* | 6/2005 | Yamazaki | ............ | H03D 13/004 375/373 |
| 2011/0163784 A1* | 7/2011 | Loeda | .................... | H03K 23/68 327/117 |
| 2012/0126862 A1* | 5/2012 | Hsueh | .................. | H03K 21/026 327/115 |
| 2012/0314833 A1* | 12/2012 | Venkatasubramanian | | H03K 19/0016 377/48 |

FOREIGN PATENT DOCUMENTS

JP 2007-074636 3/2007

* cited by examiner

*Primary Examiner* — Brandon S Cole

(74) *Attorney, Agent, or Firm* — Michael Best & Friedrich LLP

(57) ABSTRACT

A frequency dividing circuit includes: a mode selection section configured to determine an exclusive OR of a first clock signal and a first signal and output the exclusive OR as a second signal in a first operation mode, and to output the first clock signal as the second signal in a second operation mode; and a clock generation section configured to generate and output a second clock signal, based on the second signal and the second clock signal, and to output one of the second clock signal and a third clock signal, as the first signal, the third clock signal having a phase same as a phase of the second clock signal.

8 Claims, 11 Drawing Sheets

FREQUENCY DIVIDING CIRCUIT AND PHASE SYNCHRONIZATION CIRCUIT

CROSS REFERENCE TO RELATED APPLICATIONS

This application claims the benefit of Japanese Priority Patent Application JP 2014-019650 filed Feb. 4, 2014, the entire contents of which are incorporated herein by reference.

BACKGROUND

The present disclosure relates to a frequency dividing circuit dividing a frequency of an input signal and then outputting a resultant signal, and a phase synchronization circuit provided with such a frequency dividing circuit.

A frequency dividing circuit that generates a clock signal having a frequency lower than a frequency of an input clock signal based on the input clock signal is often mounted on a semiconductor device. Here, a value obtained by dividing the frequency of the input clock signal by the frequency of the generated clock signal is referred to as a dividing ratio. A duty ratio of the clock signal generated in such a way may be often desired to be about 50%.

Some of the frequency dividing circuits are configured so as to change the dividing ratio. For example, in Japanese Unexamined Patent Application Publication No. 2007-74636, a frequency dividing circuit capable of switching the dividing ratio between a predetermined odd value and a predetermined even value is disclosed.

SUMMARY

Incidentally, the semiconductor device is typically expected to have a small circuit area in terms of cost or the like, and to consume small power in terms of ecology. To achieve them, in the semiconductor device, the number of components may be desirably decreased, and the frequency dividing circuit may be desirably achieved with a small number of components.

It is desirable to provide a frequency dividing circuit and a phase synchronization circuit that are capable of realizing a circuit with a small number of components.

According to an embodiment of the technology, there is provided a frequency dividing circuit including: a mode selection section configured to determine an exclusive OR of a first clock signal and a first signal and output the exclusive OR as a second signal in a first operation mode, and to output the first clock signal as the second signal in a second operation mode; and a clock generation section configured to generate and output a second clock signal, based on the second signal and the second clock signal, and to output one of the second clock signal and a third clock signal, as the first signal, the third clock signal having a phase same as a phase of the second clock signal.

According to an embodiment of the technology, there is provided a phase synchronization circuit including: a phase frequency detector configured to compare a phase of an input clock signal with a phase of a feedback clock signal; an oscillation circuit configured to generate a first clock signal based on a comparison result of the phase frequency detector; a first frequency dividing circuit configured to divide a frequency of the first clock signal to generate a second clock signal; and a second frequency dividing circuit configured to divide a frequency of the second clock signal to generate the feedback clock signal. The first frequency dividing circuit includes a mode selection section configured to determine an exclusive OR of the first clock signal and a first signal and output the exclusive OR as a second signal in a first operation mode, and to output the first clock signal as the second signal in a second operation mode, and a clock generation section configured to generate and output the second clock signal, based on the second signal and the second clock signal, and to output one of the second clock signal and a third clock signal, as the first signal, the third clock signal having a phase same as a phase of the second clock signal.

In the frequency dividing circuit and the phase synchronization circuit according to the respective embodiments of the disclosure, the second signal is generated in the mode selection section, and the second clock signal and the first signal are generated in the clock generation section, based on the second signal and the second clock signal. At that time, in the first operation mode, the exclusive OR of the first clock signal and the first signal is output as the second signal from the mode selection section, and in the second operation mode, the first clock signal is output as the second signal from the mode selection section.

According to the frequency dividing circuit and the phase synchronization circuit according to the respective embodiments of the disclosure, the mode selection section and the clock generation section are provided. Therefore, it is possible to achieve the circuit with the small number of components. Incidentally, effects described here are non-limiting. Effects achieved by the technology may be one or more of effects described in the present disclosure.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
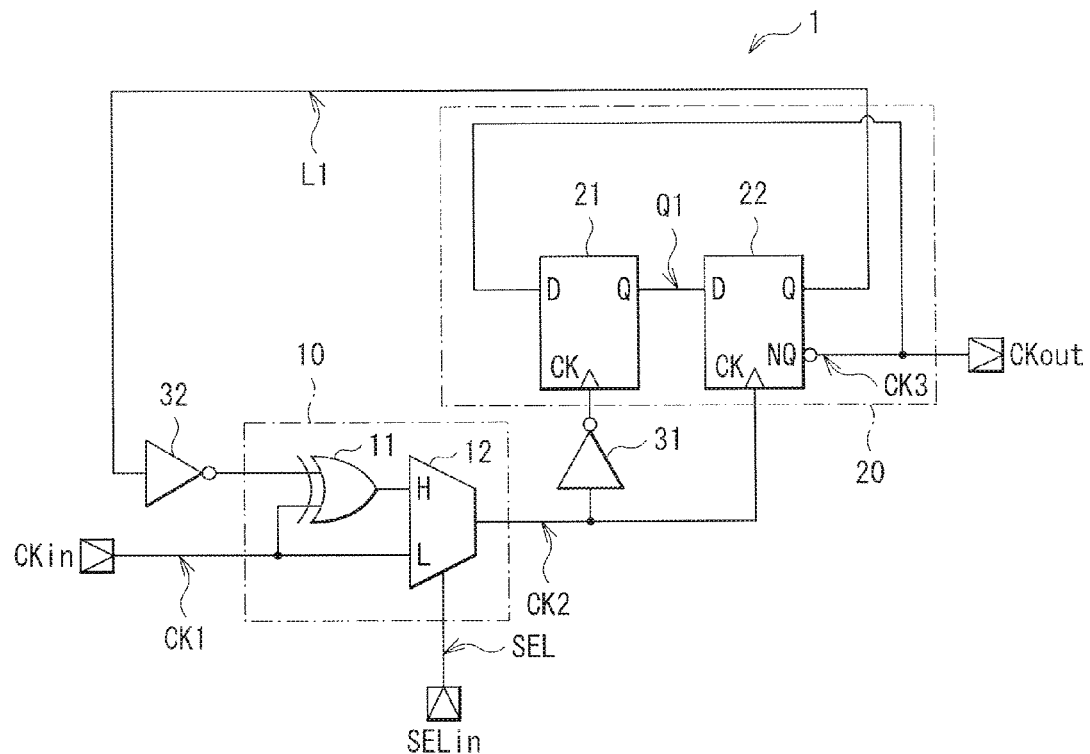
FIG. 1 is a circuit diagram illustrating a configuration example of a frequency dividing circuit according to a first embodiment of the disclosure.

Hereinafter, some embodiments of the disclosure will be described in detail with reference to drawings. Note that description will be given in the following order.
1. First Embodiment
2. Second Embodiment
3. Application examples 1. First Embodiment Configuration Example FIG. 1 illustrates a configuration example of a frequency dividing circuit according to a first embodiment. A frequency dividing circuit 1 operates at a high frequency (for example, several GHz). Note that a phase synchronization circuit according to an embodiment of the disclosure is embodied by the preset embodiment, and thus will be described together.

The frequency dividing circuit 1 divides a frequency of a clock signal CK1 input to a clock input terminal CKin, to generate a clock signal CK3, and outputs the clock signal CK3 from a clock output terminal CKout. The frequency dividing circuit 1 is capable of switching a dividing ratio between "2" and "3", based on an operation mode selection signal SEL that is input to an input terminal SELin. The frequency dividing circuit 1 includes an operation mode selection section 10, a clock generation section 20, and inverter circuits 31 and 32.

The operation mode selection section 10 generates a signal CK2, based on the clock signal CK1, an output signal of the inverter circuit 32, and the operation mode selection signal SEL. The operation mode selection section 10 includes an exclusive OR (EX-OR) circuit 11 and a selector 12.

The EX-OR circuit 11 is a logic circuit that determines an exclusive OR of the clock signal CK1 and the output signal of the inverter circuit 32. Then, the EX-OR circuit 11 supplies the signal obtained in such a way to the selector 12.

The selector 12 selects one of the output signal of the EX-OR circuit 11 and the clock signal CK1, based on the operation mode selection signal SEL, and outputs the selected signal as the signal CK2. Specifically, the selector 12 selects and outputs the output signal of the EX-OR circuit 11 as the signal CK2 when the operation mode selection signal SEL is at a high level (H). On the other hand, the selector 12 selects and outputs the clock signal CK1 as the signal CK2 when the operation mode selection signal SEL is at a low level (L).

With this configuration, the operation mode selection section 10 outputs the exclusive OR of the clock signal CK1 and the output signal of the inverter circuit 32 as the signal CK2 when the operation mode selection signal SEL is at the high level (H), and outputs the clock signal CK1 as the signal CK2 when the operation mode selection signal SEL is at the low level (L).

The inverter circuit 31 is a logic circuit determining an inverted logic of the signal CK2. Further, the inverter circuit 31 supplies the signal determined in such a way, to the clock generation section 20.

The clock generation section 20 generates the clock signal CK3 and a signal L1, based on the signal CK2 and an output signal of the inverter circuit 31. The clock generation section 20 includes latch circuits 21 and 22.

The latch circuit 21 is a so-called D-type latch circuit. When a signal input to an input terminal CK is at the high level, the latch circuit 21 outputs, from an output terminal Q, a signal input to an input terminal D, and when the signal input to the input terminal CK falls to the low level, the latch circuit 21 maintains an output signal immediately before the falling at the output terminal Q. In this example, the latch circuit 21 operates like a flip-flop circuit that operates at a rising edge of the signal input to the input terminal CK because the operation frequency is high. In other words, the latch circuit 21 samples the signal input to the input terminal D at a rising edge of the signal input to the input terminal CK, and outputs the sampling result from the output terminal Q. The clock signal CK3 output from an output terminal NQ (described later) of the latch circuit 22 is input to the input terminal D of the latch circuit 21, and the output signal of the inverter circuit 31 is input to the input terminal CK of the latch circuit 21. Then, the latch circuit 21 outputs the signal Q1 from the output terminal Q.

The latch circuit 22 is a so-called D-type latch circuit similar to the latch circuit 21. When a signal input to the input terminal CK is at the high level, the latch circuit 22 outputs, from the output terminal Q, a signal input to the input terminal D and outputs the inverted logic thereof from the output terminal NQ. When the signal input to the input terminal CK falls to the low level, the latch circuit 22 maintains the output signals immediately before the falling at the output terminals Q and NQ. In this example, similarly to the latch circuit 21, the latch circuit 22 operates like a flip-flop circuit that operates at a rising edge of the signal input to the input terminal CK because the operation frequency is high. The signal Q1 is input to the input terminal D of the latch circuit 22, and the signal CK2 is input to the input terminal CK of the latch circuit 22. Then, the latch circuit 22 outputs the signal L1 from the output terminal Q and outputs the clock signal CK3 from the output terminal NQ.

With this configuration, the latch circuit 21 samples the clock signal CK3 at a falling edge of the signal CK2 to generate the signal Q1. Then, the latch circuit 22 samples the signal Q1 at a rising edge of the signal CK2 to generate the signal L1, and generates the clock signal CK3 that is an inverted logic signal of the signal L1.

The inverter circuit 32 is a logic circuit determining an inverted logic of the signal CK2. Further, the inverter circuit 32 supplies the signal determined in such a way, to the EX-OR circuit 11 of the operation mode selection section 10.

With this configuration, when the operation mode selection signal SEL is at the high level, the frequency dividing circuit 1 generates the clock signal CK3 that has a frequency one-third of the frequency of the clock signal CK1, based on the clock signal CK1. In other words, at this time, the frequency dividing circuit 1 functions as a frequency dividing circuit whose dividing ratio is "3". In addition, when the operation mode selection signal SEL is at the low level, the frequency dividing circuit 1 generates the clock signal CK3 that has a frequency half of the frequency of the clock signal CK1, based on the clock signal CK1. In other words, at this time, the frequency dividing circuit 1 functions as a frequency dividing circuit whose dividing ratio is "2".

Here, the operation mode selection section 10 corresponds to a specific but non-limiting example of "mode selection section" in the disclosure. The clock generation section 20 and the inverter circuit 32 correspond to a specific but non-limiting example of "clock generation section" in the disclosure. The clock signal CK1 corresponds to a specific but non-limiting example of "first clock signal" in the disclosure. The clock signal CK3 corresponds to a specific but non-limiting example of "second clock signal" in the disclosure. The output signal of the inverter circuit 32 corresponds to a specific but non-limiting example of "first signal" in the disclosure. The signal CK2 corresponds to a specific but non-limiting example of "second signal" in the disclosure. The latch circuit 21 corresponds to a specific but non-limiting example of "first sampling circuit" in the disclosure. The latch circuit 22 corresponds to a specific but non-limiting example of "second sampling circuit" in the disclosure.

(Operation and Function)

Subsequently, operation and a function of the frequency dividing circuit 1 according to the first embodiment will be described.

(General Operation Outline)

First, general operation outline of the frequency dividing circuit 1 is described with reference to FIG. 1. When the operation mode selection signal SEL is at the high level (H), the operation mode selection section 10 determines the exclusive OR of the clock signal CK1 and the output signal of the inverter circuit 32 and outputs the determined exclusive OR as the signal CK2. When the operation mode selection signal SEL is at the low level (L), the operation mode selection section 10 outputs the clock signal CK1 as the signal CK2. The inverter circuit 31 determines the inverted logic of the signal CK2. The clock generation section 20 generates the clock signal CK3 and the signal L1, based on the signal CK2 and the output signal of the inverter 31. The inverter circuit 32 determines the inverted logic of the signal CK2.

(Detailed Operation)

Next, the detailed operation of the frequency dividing circuit 1 will be described separately for a case where the operation mode selection signal SEL is at the high level (H) and for a case where the operation mode selection signal SEL is at the low level (L). First, the case where the operation mode selection signal SEL is at the high level (H) will be descried.

Figure 2:
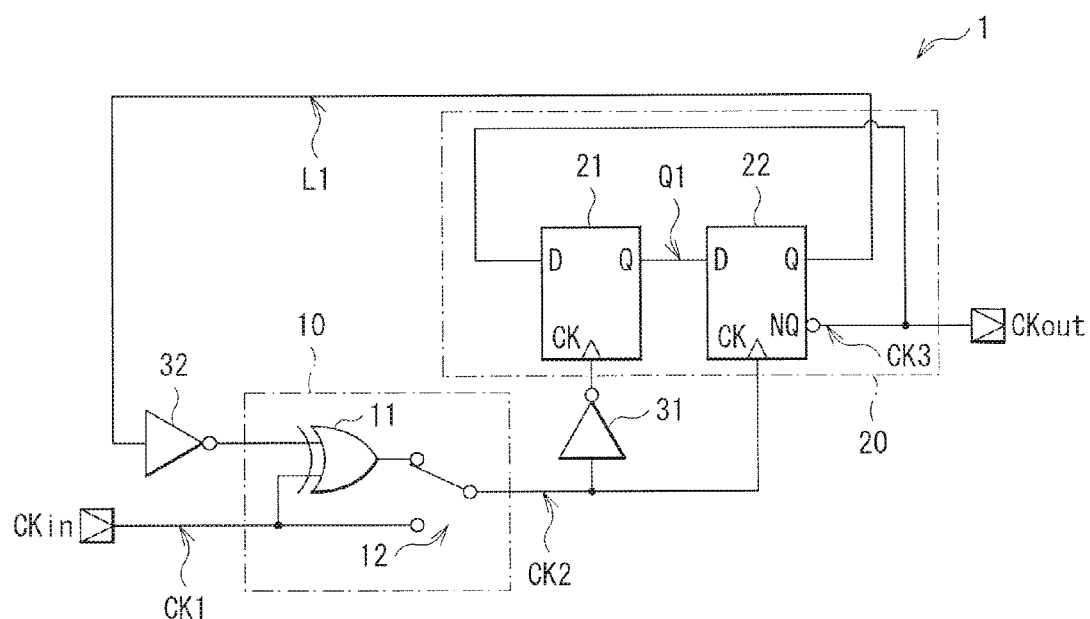
FIG. 2 is an explanatory diagram illustrating operation in one operation mode of the frequency dividing circuit illustrated in FIG. 1.

FIG. 2 illustrates operation of the frequency dividing circuit 1 when the operation mode selection signal SEL is at the high level (H). In FIG. 2, the selector 12 is illustrated as a switch indicating an operation state thereof. When the operation mode selection signal SEL is at the high level (H), the selector 12 selects and outputs the output signal of the EX-OR circuit 11 as the signal CK2. Incidentally, since the frequency dividing circuit 1 operates at a high frequency, the rising time and the falling time of each waveform are long; however, a short rising time or a short falling time is illustrated for convenience of description.

Figure 3:
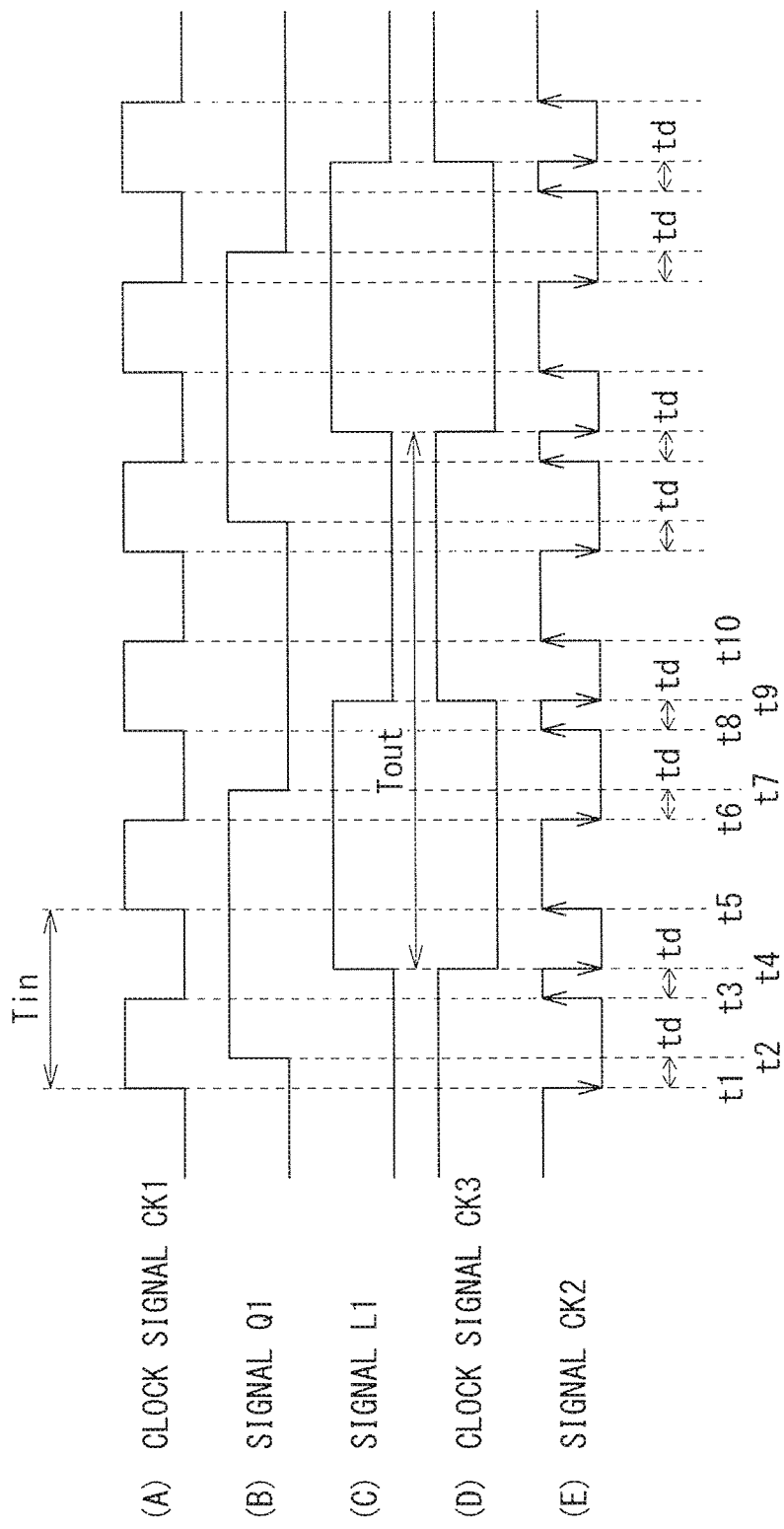
FIG. 3 is a timing waveform chart illustrating an operation example of the frequency dividing circuit illustrated in FIG. 1.

FIG. 3 is a timing chart of the operation of the frequency dividing circuit 1 when the operation mode selection signal SEL is at the high level (H), where (A) illustrates a waveform of the clock signal CK1, (B) illustrates a waveform of the signal Q1, (C) illustrates a waveform of the signal L1, (D) illustrates a waveform of the clock signal CK3, and (E) illustrates a waveform of the signal CK2. In this example, as an initial state, the clock signal CK1, the signal Q1, and the signal L1 are set to the low level ((A) to (C) of FIG. 3), and the clock signal CK3 and the signal CK2 are set to the high level ((D) and (E) of FIG. 3).

When the operation mode selection signal SEL is at the high level (H), the frequency dividing circuit 1 generates the clock signal CK3 that has a frequency one-third of the frequency of the clock signal CK1 and has a duty ratio of about 50%, based on the clock signal CK1 having the duty ratio of about 50%, as will be described below.

First, the clock signal CK1 changes from the low level to the high level at a timing t1 ((A) of FIG. 3). At this time, since the signal L1 ((C) of FIG. 3) is at the low level and the output signal of the inverter circuit 32 is at the low level, the output signal (the signal CK2) of the EX-OR circuit 11 changes from the high level to the low level ((E) of FIG. 3). The latch circuit 21 samples the clock signal CK3 (the high level) at a falling edge of the signal CK2 ((D) of FIG. 3). As a result, the signal Q1 changes from the low level to the high level at a timing t2 that is delayed by a delay time td from the timing t1 ((B) of FIG. 3). Here, the delay time td is a delay time between the input terminal CK and the output terminal Q in the latch circuits 21 and 22.

Next, the clock signal CK1 changes from the high level to the low level at a timing t3 ((A) of FIG. 3). At this time, the signal L1 ((C) of FIG. 3) is at the low level and the output signal of the inverter 32 is at the high level. Therefore, the output signal (the signal CK2) of the EX-OR circuit 11 changes from the low level to the high level ((E) of FIG. 3). The latch circuit 22 samples the signal Q1 (the high level) at the rising edge of the signal CK2 ((B) of FIG. 3). As a result, the signal L1 changes from the low level to the high level ((C) of FIG. 3) and the clock signal CK3 changes from the high level to the low level ((D) of FIG. 3) at a timing t4 that is delayed by the delay time td from the timing t3. In response to the change of the signal L1, the output signal of the inverter circuit 32 changes from the high level to the low level. Therefore, the output signal (the signal CK2) of the EX-OR circuit 11 changes from the high level to the low level ((E) of FIG. 3). Then, the latch circuit 21 samples the clock signal CK3 at the falling edge of the signal CK2 ((D) of FIG. 3). At this time, the clock signal CK3 changes from the high level to the low level. Therefore, the clock signal CK3 at the level (the high level) immediately before the change is sampled. As a result, the signal Q1 maintains the high level ((B) of FIG. 3).

Next, the clock signal CK1 changes from the low level to the high level at a timing t5 ((A) of FIG. 3). At this time, the signal L1 ((C) of FIG. 3) is at the high level and the output signal of the inverter circuit 32 is at the low level. Therefore, the output signal (the signal CK2) of the EX-OR circuit 11 changes from the low level to the high level ((E) of FIG. 3). The latch circuit 22 samples the signal Q1 (the high level) at the rising edge of the signal CK2 ((B) of FIG. 3). As a result, the signal L1 maintains the high level ((C) of FIG. 3) and the clock signal CK3 maintains the low level ((D) of FIG. 3).

Next, the clock signal CK1 changes from the high level to the low level at a timing t6 ((A) of FIG. 3). At this time, the signal L1 ((C) of FIG. 3) is at the high level and the output signal of the inverter circuit 32 is at the low level. Therefore, the output signal (the signal CK2) of the EX-OR circuit 11 changes from the high level to the low level ((E) of FIG. 3). The latch circuit 21 samples the clock signal CK3 (the low level) at the falling edge of the signal CK2 ((D) of FIG. 3). As a result, the signal Q1 changes from the high level to the low level at a timing t7 that is delayed by the delay time td from the timing t6 ((B) of FIG. 3).

Next, the clock signal CK1 changes from the low level to the high level at a timing t8 ((A) of FIG. 3). At this time, the signal L1 ((C) of FIG. 3) is at the high level and the output signal of the inverter circuit 32 is at the low level. Therefore, the output signal (the signal CK2) of the EX-OR circuit 11 changes from the low level to the high level ((E) of FIG. 3). The latch circuit 22 samples the signal Q1 (the low level) at the rising edge of the signal CK2 ((B) of FIG. 3). As a result, the signal L1 changes from the high level to the low level ((C) of FIG. 3) and the clock signal CK3 changes from the low level to the high level ((D) of FIG. 3) at a timing t9 that is delayed by the delay time td from the timing t8. In response to the change of the signal L1, the output signal of the inverter circuit 32 changes from the low level to the high level. Therefore, the output signal (the signal CK2) of the EX-OR circuit 11 changes from the high level to the low level ((E) of FIG. 3). Then, the latch circuit 21 samples the clock signal CK3 at the falling edge of the signal CK2 ((D) of FIG. 3). At this time, the clock signal CK3 changes from the low level to the high level. Therefore, the clock signal CK3 at the level (the low level) immediately before the change is sampled. As a result, the signal Q1 maintains the low level ((B) of FIG. 3).

Next, the clock signal CK1 changed from the high level to the low level at a timing t10 ((A) of FIG. 3). At this time, the signal L1 ((C) of FIG. 3) is at the low level and the output signal of the inverter circuit 32 is at the high level. Therefore, the output signal (the signal CK2) of the EX-OR circuit 11 changes from the low level to the high level ((E) of FIG. 3). The latch circuit 22 samples the signal Q1 (the low level) at the rising edge of the signal CK2 ((B) of FIG. 3). As a result, the signal L1 maintains the low level ((C) of FIG. 3) and the clock signal CK3 maintains the high level ((D) of FIG. 3).

Thereafter, the frequency dividing circuit 1 repeats the operation from the timing t1 to the timing t10. In this way, when the operation mode selection signal SEL is at the high level (H), the frequency dividing circuit 1 generates the clock signal CK3 that has a period Tout that is three times a period Tin of the clock signal CK1. In other words, the frequency dividing circuit 1 generates the clock signal CK3 that has a frequency one-third of the frequency of the clock signal CK1 and the duty ratio of about 50%, based on the clock signal CK1 having the duty ratio of about 50%.

Next, the case where the operation mode selection signal SEL is at the low level (L) will be described.

Figure 4:
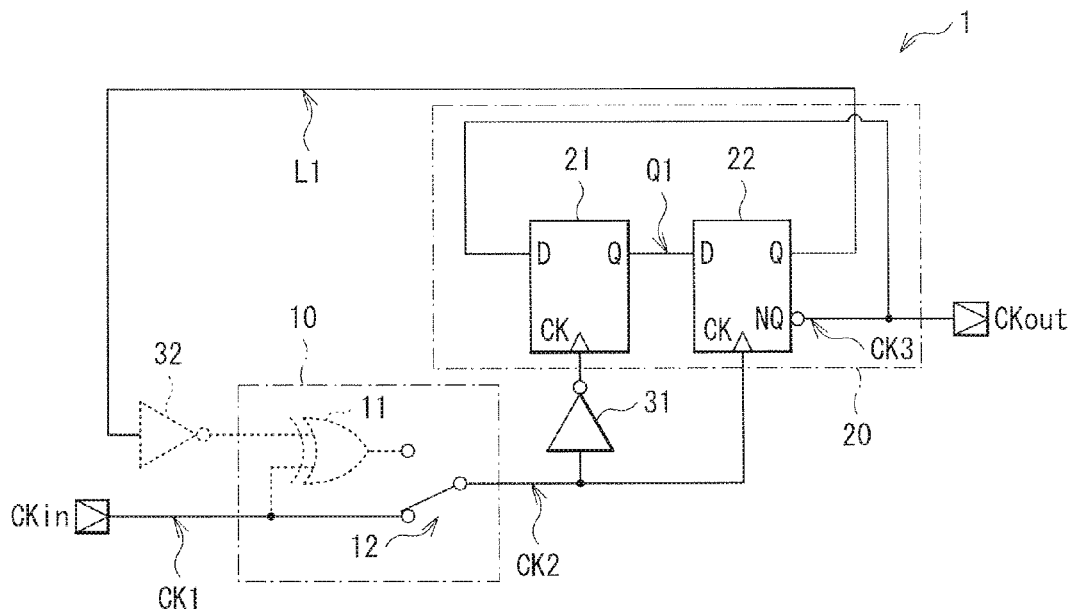
FIG. 4 is an explanatory diagram illustrating operation in another operation mode of the frequency dividing circuit illustrated in FIG. 1.

FIG. 4 illustrates the operation of the frequency dividing circuit 1 when the operation mode selection signal SEL is at the low level (L). In FIG. 4, a part illustrated by a dashed line indicates a part substantially not contributing to the circuit operation of the frequency dividing circuit 1. When the operation mode selection signal SEL is at the low level (L), the selector 12 selects and outputs the clock signal CK1 as the signal CK2. Specifically, in this operation mode, the signal CK2 has a waveform similar to that of the clock signal CK1, and the frequency dividing circuit 1 operates without using a feedback path from the clock generation section 20 to the inverter circuit 32 and the operation mode selection section 10.

Figure 5:
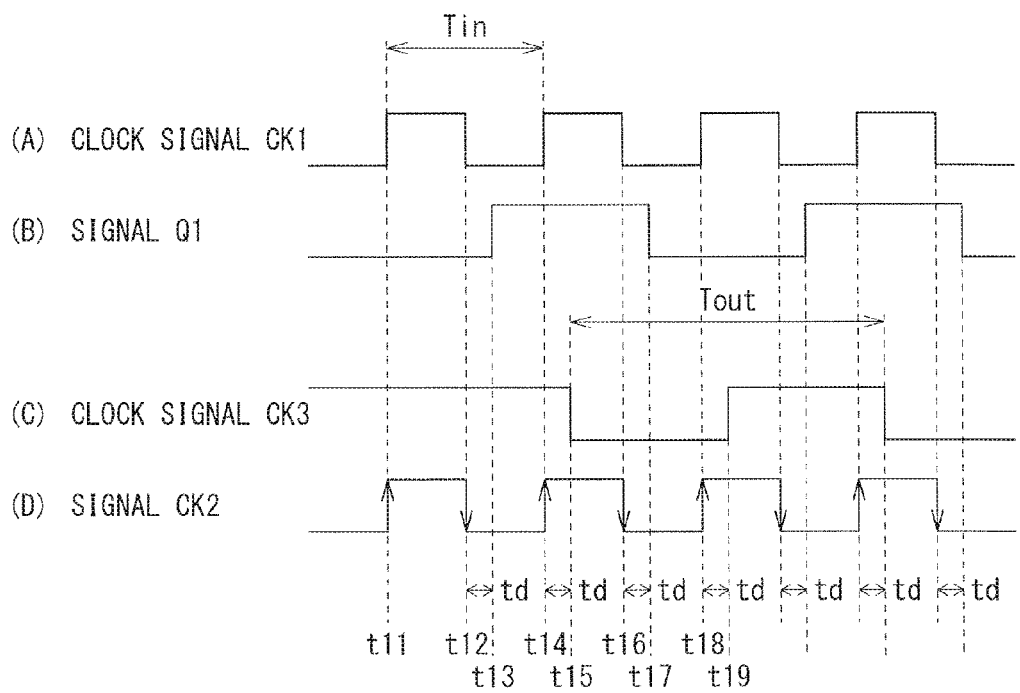
FIG. 5 is a timing waveform chart illustrating another operation example of the frequency dividing circuit illustrated in FIG. 1.

FIG. 5 is a timing chart of the operation of the frequency dividing circuit 1 when the operation mode selection signal SEL is at the low level (L), where (A) illustrates a waveform of the clock signal CK1, (B) illustrates a waveform of the signal Q1, (C) illustrates a waveform of the clock signal CK3, and (D) illustrates a waveform of the signal CK2. In this example, as an initial state, the clock signal CK1, the signal Q1, and the signal CK2 are set to the low level ((A), (B), and (D) of FIG. 5), and the clock signal CK3 is set to the high level ((C) of FIG. 5).

When the operation mode selection signal SEL is at the low level (L), the frequency dividing circuit 1 generates the clock signal CK3 that has a frequency half of the frequency of the clock signal CK1 and the duty ratio of about 50%, based on the clock signal CK1 having the duty ratio of about 50%, as will be described below.

First, the clock signal CK1 and the signal CK2 each change from the low level to the high level at a timing t11 ((A) and (D) of FIG. 5). The latch circuit 22 samples the signal Q1 (the low level) at the rising edge of the signal CK2 ((B) of FIG. 5). As a result, the clock signal CK3 that is the inverted logic signal of the signal L1 maintains the high level ((C) of FIG. 5).

Next, the clock signal CK1 and the signal CK2 each change from the high level to the low level at a timing t12 ((A) and (D) of FIG. 5). The latch circuit 21 samples the clock signal CK3 (the high level) at the falling edge of the signal CK2 ((C) of FIG. 5). As a result, the signal Q1 changes from the low level to the high level at a timing t13 that is delayed by the delay time td from the timing t12 ((B) of FIG. 5).

Next, the clock signal CK1 and the signal CK2 each change from the low level to the high level at a timing t14 ((A) and (D) of FIG. 5). The latch circuit 22 samples the signal Q1 (the high level) at the rising edge of the signal CK2 ((B) of FIG. 5). As a result, the clock signal CK3 that is the inverted logic signal of the signal L1 changes from the high level to the low level at a timing t15 that is delayed by the delay time td from the timing t14 ((C) of FIG. 5).

Next, the clock signal CK1 and the signal CK2 each change from the high level to the low level at a timing t16 ((A) and (D) of FIG. 5). The latch circuit 21 samples the clock signal CK3 (the low level) at the falling edge of the signal CK2 ((C) of FIG. 5). As a result, the signal Q1 changes from the high level to the low level at a timing t17 that is delayed by the delay time td from the timing t16 ((B) of FIG. 5).

Next, the clock signal CK1 and the signal CK2 each change from the low level to the high level at a timing t18 ((A) and (D) of FIG. 5). The latch circuit 22 samples the signal Q1 (the low level) at the rising edge of the signal CK2 ((B) of FIG. 5). As a result, the clock signal CK3 that is the inverted logic signal of the signal L1 changes from the low level to the high level at a timing t19 that is delayed by the delay time td from a timing t18 ((C) of FIG. 5).

After that, the frequency dividing circuit 1 repeats the operation from the timing t12 to the timing t19. In this way, when the operation mode selection signal SEL is at the low level (L), the frequency dividing circuit 1 generates the clock signal CK3 having a period Tout that is twice the period Tin of the clock signal CK1. In other words, the frequency dividing circuit 1 generates the clock signal CK3 that has a frequency half of the frequency of the clock signal CK1 and the duty ratio of about 50%, based on the clock signal CK1 having the duty ratio of about 50%.

As described above, the frequency dividing circuit 1 is allowed to switch the dividing ratio between "2" and "3" in response to the operation selection signal SEL, and to generate the clock signal CK3 having the duty ratio of about 50%.

Comparative Example

Next, a frequency dividing circuit 1R according to a comparative example is described. The frequency dividing circuit 1R is configured to switch the dividing ratio between "2" and "3", based on the frequency dividing circuit described in Japanese Unexamined Patent Application Publication No. 2007-74636.

Figure 6:
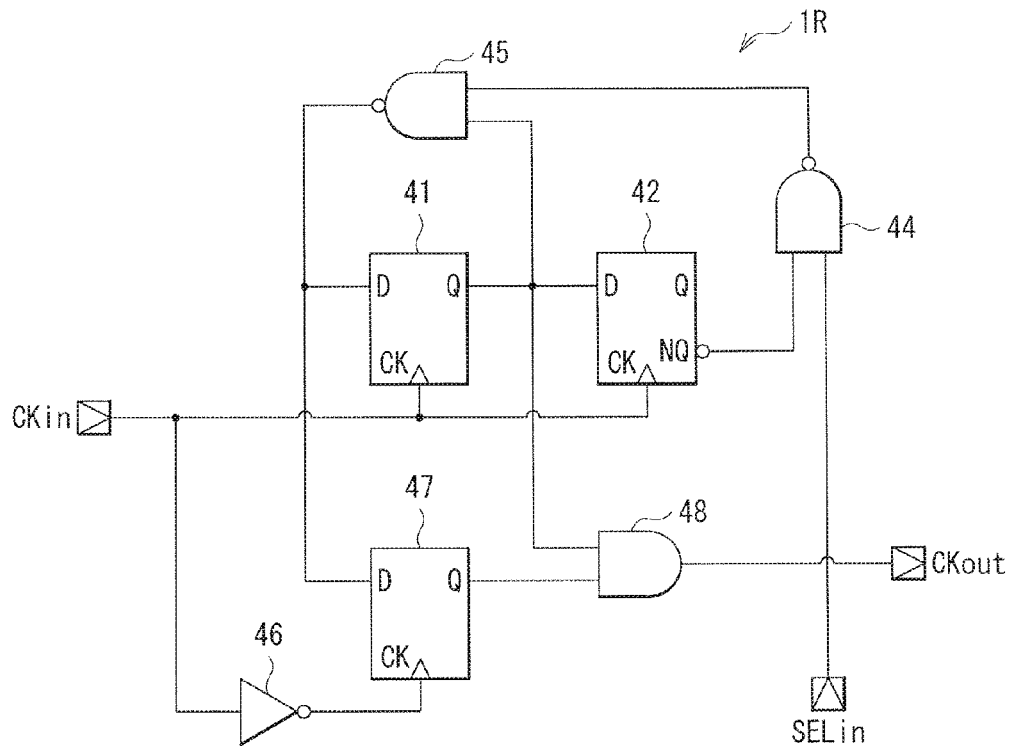
FIG. 6 is a circuit diagram illustrating a configuration example of a frequency dividing circuit according to a comparative example.

FIG. 6 illustrates a configuration example of the frequency dividing circuit 1R according to the comparative example. The frequency dividing circuit 1R includes flip-flop circuits 41, 42, and 47, inverted AND (NAND) circuits 44 and 45, an inverter circuit 46, and an AND circuit 48.

Each of the flip-flop circuits 41 and 47 samples a signal input to the input terminal D at the rising edge of a signal input to the input terminal CK, and outputs the sampling result from an output terminal Q. The flip-flop circuit 42 samples a signal input to the input terminal D at the rising edge of a signal input to the input terminal CK, and outputs the inverted logic of the sampling result from the output terminal NQ. Specifically, each of the flip-flop circuits 41, 42, and 47 is typically configured using two latch circuits. The input terminal D of the flip-flop circuit 41 is connected to an output terminal of the NAND circuit 45 and the like, the input terminal CK thereof is connected to a clock input terminal CKin of the frequency dividing circuit 1R and the like, and the output terminal Q thereof is connected to the input terminal D of the flip-flop circuit 42, a first input terminal of the NAND circuit 45, and a first input terminal of the AND circuit 48. The input terminal D of the flip-flop circuit 42 is connected to the output terminal Q of the flip-flop circuit 41 and the like, the input terminal CK thereof is connected to the clock input terminal CKin of the frequency dividing circuit 1R, and the output terminal NQ thereof is connected to a first input terminal of the NAND circuit 44. The first input terminal of the NAND circuit 44 is connected to the output terminal NQ of the flip-flop circuit 42, a second input terminal thereof is connected to an input terminal SELin of the frequency dividing circuit 1R, and an output terminal thereof is connected to a second input terminal of the NAND circuit 45. The first input terminal of the NAND circuit 45 is connected to the output terminal Q of the flip-flop circuit 41 and the like, the second input terminal is connected to the output terminal of the NAND circuit 44, and the output terminal thereof is connected to the input terminal D of each of the flip-flop circuits 41 and 47. An input terminal of the inverter circuit 46 is connected to the clock input terminal CKin of the frequency dividing circuit 1R and the like, and an output terminal thereof is connected to the input terminal CK of the flip-flop circuit 47. The input terminal D of the flip-flop circuit 47 is connected to the output terminal of the AND circuit 45 and the like, the input terminal CK thereof is connected to the output terminal of the inverter circuit 46, and the output terminal Q thereof is connected to a second input terminal of the AND circuit 48. The first input terminal of the AND circuit 48 is connected to the output terminal Q of the flip-flop circuit 41 and the like, the second input terminal thereof is connected to the output terminal Q of the flip-flop circuit 47, and the output terminal thereof is connected to the clock output terminal CKout of the frequency dividing circuit 1R.

As described above, the frequency dividing circuit 1R is configured of the three flip-flop circuits 41, 42, and 47 and the four logic gates (the NAND circuits 44 and 45, the inverter circuit 46, and the AND circuit 48). Typically, the semiconductor device is expected to be small in circuit area in terms of cost and the like, and to consume small power in terms of ecology. Therefore, the semiconductor device may be desirably have a small number of components, and also in the frequency dividing circuit, it is desirable to achieve the circuit with a small number of components. In particular, when a clock signal of high frequency is input to the frequency dividing circuit, high-speed operation is desired. Therefore, consumed power is increased. In such a case, it is necessary to configure the frequency dividing circuit in such a manner that the frequency dividing circuit is allowed to operate at high speed while reducing the consumed power.

On the other hand, the frequency dividing circuit 1 according to the first embodiment is configured of the two latch circuits 21 and 22, the EX-OR circuit 11, the selector 12, and the inverters 31 and 32. In other words, in the frequency dividing circuit 1 according to the first embodiment, it is possible to reduce the number of latch circuits as compared with the frequency dividing circuit 1R according to the comparative example. The latch circuit is larger in circuit size and power consumption than other logic gates. Therefore, in the frequency dividing circuit 1, reducing the number of latch circuits makes it possible to decrease the circuit area and to reduce consumed power.

(Effects)

As described above, in the first embodiment, the frequency dividing circuit is configured using the operation mode selection section and the clock generation section. Therefore, it is possible to achieve the frequency dividing circuit that is capable of switching the dividing ratio between "2" and "3" with a small number of components.

Modification 1-1

In the above-described embodiment, the signal L1 output from the output terminal Q of the latch circuit 22 is supplied to the EX-OR circuit 11 of the operation mode selection section 10 through the inverter circuit 32.

Figure 7:
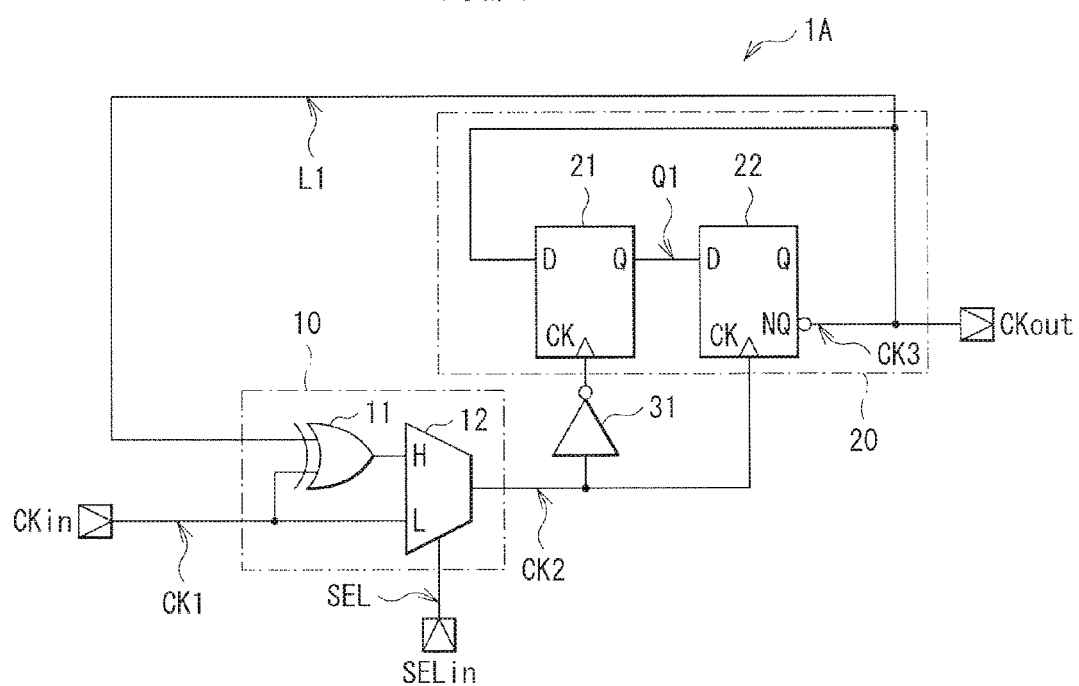
FIG. 7 is a circuit diagram illustrating a configuration example of a frequency dividing circuit according to a modification of the first embodiment.

However, the configuration is not limited thereto. Alternatively, for example, as with a frequency dividing circuit 1A illustrated in FIG. 7, the clock signal CK3 output from the output terminal NQ of the latch circuit 22 may be supplied to the EX-OR circuit 11 of the operation mode selection section 10.

Modification 1-2

The frequency dividing circuit 1 may be configured of a circuit handling a single-ended signal such as a so-called complementary MOS (CMOS) circuit or a differential circuit handling a differential signal. A case where the frequency dividing circuit is configured of a differential circuit will be described below.

Figure 8:
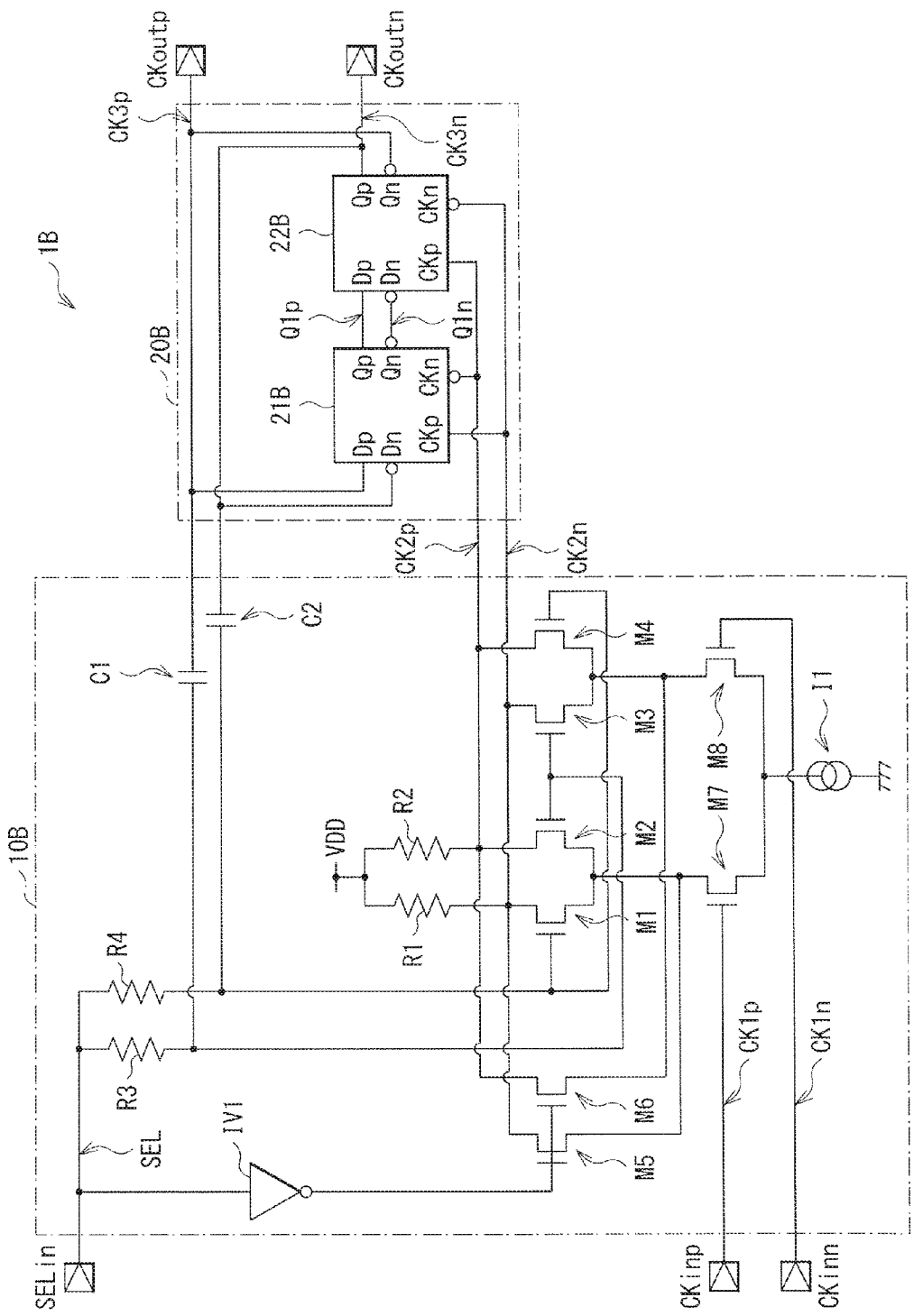
FIG. 8 is a circuit diagram illustrating a configuration example of a frequency dividing circuit according to another modification of the first embodiment.

FIG. 8 illustrates a configuration example of a frequency dividing circuit 1B according to the present modification. The frequency dividing circuit 1B is configured of a current mode logic (CML). The frequency dividing circuit 1B divides the frequency of each of clock signals CK1$p$ and K1$n$ that are input to clock input terminals CKinp and CKinn, respectively, to generate clock signals CK3$p$ and CK3$n$, and outputs the clock signals CK3$p$ and CK3$n$ from a clock output terminal CKout. The clock signals CK1$p$ and CK1$n$ configure the differential signal, where the clock signal CK1$p$ is a positive phase signal, and the clock signal CK1$n$ is a negative phase signal. The clock signals CK3$p$ and CK3$n$ configure the differential signal, where the clock signal CK3$p$ is a positive phase signal, and the clock signal CK3$n$ is a negative phase signal. The frequency dividing circuit 1B includes an operation mode selection section 10B and a clock generation section 20B.

The operation mode selection section 10B includes resistors R1 to R4, capacitors C1 and C2, an inverting circuit IV1, transistors M1 to M8, and a current source I1.

A first end of the resistor R1 is supplied with a source voltage VDD, and a second end thereof is connected to drains of the respective transistors M1, M3, and M5 and the clock generation section 20B. A first end of the resistor R2 is supplied with the source voltage VDD, and a second end thereof is connected to drains of the respective transistors M2, M4, and M6 and the clock generation section 20B. A signal CK2$n$ is generated at the second end of the resistor R1, and a signal CK2p is generated at the second end of the resistor R2. The signals CK2p and CK2n configure the differential signal, where the signal CK2p is a positive phase signal, and the signal CK2n is a negative phase signal. A first end of the resistor R3 is connected to the input terminal SELin, and a second end thereof is connected to a first end of the capacitor C1 and gates of the respective transistors M2 and M3. A first end of the resistor R4 is connected to the input terminal SELin, and a second end thereof is connected to a first end of the capacitor C2 and gates of the respective transistors M1 and M4.

The first end of the capacitor C1 is connected to the second end of the resistor R3 and the gates of the respective transistors M2 and M3, and a second end thereof is connected to the clock generation section 20B. The first end of the capacitor C2 is connected to the second end of the resistor R4 and the gates of the respective transistors M1 and M4, and a second end thereof is connected to the clock generation section 20B.

The input terminal of the inverting circuit IV1 is connected to the input terminal SELin, and the output terminal thereof is connected to the gates of the respective transistors M5 and M6.

Each of the transistors M1 to M8 is an N-channel metal oxide semiconductor (MOS) field effect transistor (FET). The drain of the transistor M1 is connected to the second end of the resistor R1, the drains of the respective transistors M3 and M5, and the clock generation section 20B. The gate thereof is connected to the second end of the resistor R4, the first end of the capacitor C2, and the gate of the transistor M4. A source thereof is connected to sources of the respective transistors M2 and M5 and a drain of the transistor M7. The drain of the transistor M2 is connected to the second end of the resistor R2, the drains of the respective transistors M4 and M6, and the clock generation section 20B. The gate thereof is connected to the second end of the resistor R3, the first end of the capacitor C1, and the gate of the transistor M3. The source thereof is connected to the sources of the respective transistors M1 and M5 and the drain of the transistor M7. The drain of the transistor M3 is connected to the second end of the resistor R1, the drains of the respective transistors M1 and M5, and the clock generation section 20B. The gate thereof is connected to the second end of the resistor R3, the first end of the capacitor C1, and the gate of the transistor M2. A source thereof is connected to sources of the respective transistors M4 and M6 and a drain of the transistor M8. The drain of the transistor M4 is connected to the second end of the resistor R2, the drains of the respective transistors M2 and M6, and the clock generation section 20B. The gate thereof is connected to the second end of the resistor R4, the first end of the capacitor C2, and the gate of the transistor M1. The source thereof is connected to the sources of the respective transistors M3 and M6 and the drain of the transistor M8. The drain of the transistor M5 is connected to the second end of the resistor R1, the drains of the respective transistors M1 and M3, and the clock generation section 20B. A gate thereof is connected to the output terminal of the inverting circuit IV1 and a gate of the transistor M6. The source thereof is connected to the sources of the respective transistors M1 and M2 and the drain of the transistor M7. The drain of the transistor M6 is connected to the second end of the resistor R2, the drains of the respective transistors M2 and M4, and the clock generation section 20B. The gate thereof is connected to the output terminal of the inverting circuit IV1 and the gate of the transistor M5. The source thereof is connected to the sources of the respective transistors M3 and M4 and the drain of the transistor M8. The drain of the transistor M7 is connected to the sources of the respective transistors M1, M2, and M5, a gate thereof is connected to the clock input terminal CKinp, and a source thereof is connected to a source of the transistor M8 and a first end of the current source I1. The drain of the transistor M8 is connected to the sources of the respective transistors M3, M4, and M6, a gate thereof is connected to the clock input terminal CKinn, and the source thereof is connected to the source of the transistor M7 and the first end of the current source I1.

The first end of the current source I1 is connected to the sources of the respective transistors M7 and M8, and a second end thereof is grounded.

Here, the resistors R1 to R4 correspond to specific but non-limiting examples of "first resistor", "second resistor", "third resistor", and "fourth resistor", respectively, in the disclosure. The capacitor C1 corresponds to a specific but non-limiting example of "first capacitor" in the disclosure. The capacitor C2 corresponds to a specific but non-limiting example of "second capacitor" in the disclosure. The transistors M1 to M8 correspond to specific but non-limiting examples of "first transistor", "second transistor", "third transistor", "fourth transistor", "fifth transistor", "sixth transistor", "seventh transistor", and "eighth transistor", respectively, in the disclosure. The current source I1 corresponds to a specific but non-limiting example of "constant current source" in the disclosure.

The clock generation section 20B includes latch circuits 21B and 22B. An input terminal Dp of the latch circuit 21B is connected to an output terminal Qn of the latch circuit 22B, the second end of the capacitor C1, and a clock output terminal CKoutp. An input terminal Dn thereof is connected to an output terminal Qp of the latch circuit 22B, the second end of the capacitor C2, and a clock output terminal CKoutn. An input terminal CKp of the latch circuit 21B is connected to an input terminal CKn of the latch circuit 22B, the drains of the respective transistors M1, M3, and M5, and the second end of the resistor R1. An input terminal CKn thereof is connected to an input terminal CKp of the latch circuit 22B, the drains of the transistors M2, M4, and M6, and the second end of the resistor R2. An output terminal Qp of the latch circuit 21B is connected to an input terminal Dp of the latch circuit 22B, and an output terminal Qn of the latch circuit 21B is connected to an input terminal Dn of the latch circuit 22B.

The input terminal Dp of the latch circuit 22B is connected to the output terminal Qp of the latch circuit 21B, and the input terminal Dn of the latch circuit 22B is connected to the output terminal Qn of the latch circuit 21B. The input terminal CKp of the latch circuit 22B is connected to the input terminal CKn of the latch circuit 21B, the drains of the respective transistors M2, M4, and M6, and the second end of the resistor R2. The input terminal CKn thereof is connected to the input terminal CKp of the latch circuit 21B, the drains of the transistors M1, M3, and M5, and the second end of the resistor R1. The output terminal Qp of the latch circuit 22B is connected to the input terminal Dn of the latch circuit 21B, the second end of the capacitor C2, and the clock output terminal CKoutn. The output terminal Qn thereof is connected to the input terminal Dp of the latch circuit 21B, the second end of the capacitor C1, and the clock output terminal CKoutp. A clock signal CK3p is generated at the output terminal Qn of the latch circuit 22B, and a clock signal CK3n is generated at the output terminal Qp.

Figure 9:
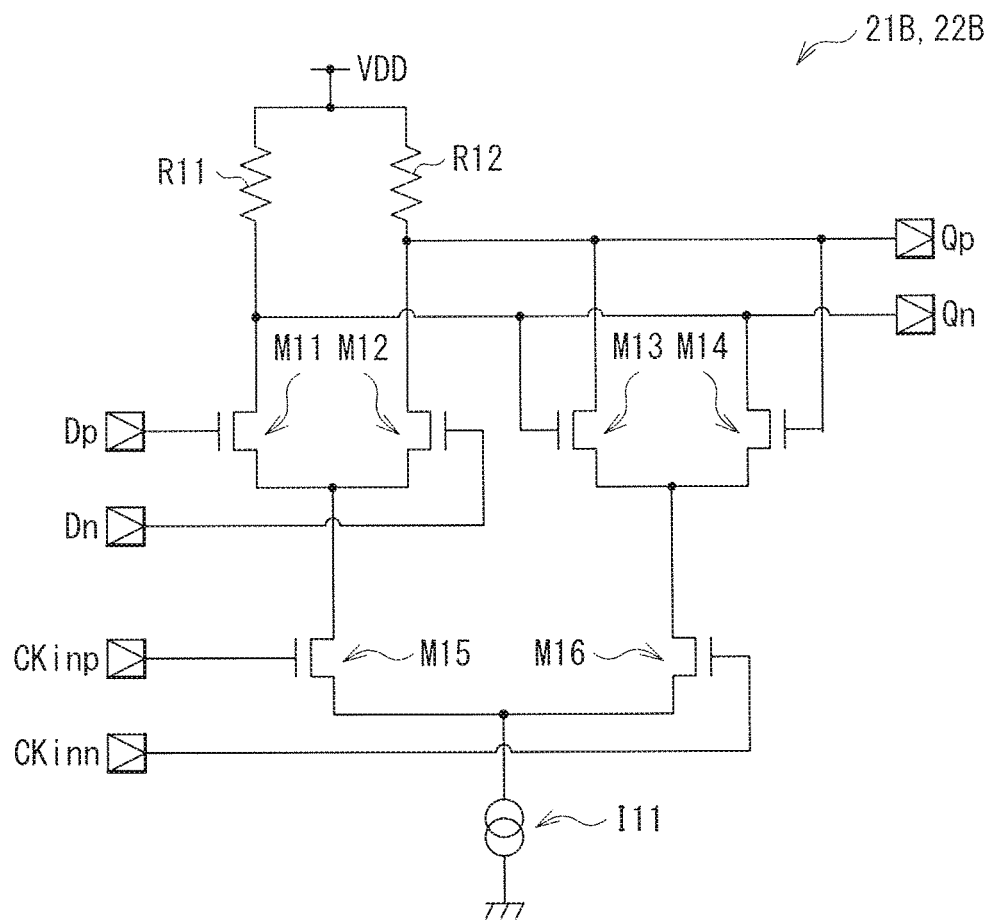
FIG. 9 is a circuit diagram illustrating a configuration example of a latch circuit illustrated in FIG. 8.

FIG. 9 illustrates a configuration example of the latch circuits 21B and 22B. The latch circuits 21B and 22B each include resistors R11 and R12, transistors M11 to M16, and a current source I11.

A first end of the resistor R11 is supplied with the source voltage VDD, and a second end thereof is connected to drains of the respective transistors M11 and M14, a gate of the transistor M13, and the output terminal Qp. A first end of the resistor R12 is supplied with the source voltage VDD, and a second end thereof is connected to drains of the respective transistors M12 and M13, a gate of the transistor M14, and the output terminal Qn.

In this example, each of the transistors M11 to M16 is an N-channel MOSFET. The drain of the transistor M11 is connected to the second end of the resistor R11, the gate of the transistor M13, the drain of the transistor M14, and the output terminal Qn. A gate thereof is connected to the input terminal Dp, and a source thereof is connected to a source of the transistor M12 and a drain of the transistor M15. The drain of the transistor M12 is connected to the second end of the resistor R12, the drain of the transistor M13, the gate of the transistor M14, and the output terminal Qp. A gate thereof is connected to the input terminal Dn, and the source thereof is connected to the source of the transistor M11 and the drain of the transistor M15. The drain of the transistor M13 is connected to the second end of the resistor R12, the drain of the transistor M12, the gate of the transistor M14, and the output terminal Qp. The gate thereof is connected to the second end of the resistor R11, the drains of the respective transistors M11 and M14, and the output terminal Qn. A source thereof is connected to a source of the transistor M14 and a drain of the transistor M16. The drain of the transistor M14 is connected to the second end of the resistor R11, the drain of the transistor M11, the gate of the transistor M13, and the output terminal Qn. The gate thereof is connected to the second end of the resistor R12, the drains of the respective transistors M12 and M13, and the output terminal Qp. The source thereof is connected to the source of the transistor M13 and the drain of the transistor M16. The drain of the transistor M15 is connected to the sources of the respective transistors M11 and M12, a gate thereof is connected to the input terminal CKinp, and a source thereof is connected to a source of the transistor M16 and a first end of the current source I11. The drain of the transistor M16 is connected to the sources of the respective transistors M13 and M14, a gate thereof is connected to the input terminal CKinn, and the source thereof is connected to the source of the transistor M15 and the first end of the current source I11.

The first end of the current source I11 is connected to the sources of the respective transistors M15 and M16, and a second end thereof is grounded.

With this configuration, the operation mode selection section 10B functions as the EX-OR circuit when the operation mode selection signal SEL is at the high level (H), and functions as a buffer circuit when the operation mode selection signal SEL is at the low level (L).

Specifically, when the operation mode selection signal SEL is at the high level (H), a high level voltage of the operation mode selection signal SEL is applied as a bias voltage to the gates of the respective transistors M1 to M4 through the resistors R3 and R4. In addition, since the inverter circuit IV1 outputs a low level voltage, the low level voltage is applied to the gates of the respective transistors M5 and M6, and thus the transistors M5 and M6 are put into an off state. Accordingly, the resistors R1 and R2, the transistors M1 to M4, M7, and M8, and the current source I1 operate as the EX-OR circuit.

Moreover, when the operation mode selection signal SEL is at the low level (L), the low level voltage of the operation mode selection signal SEL is applied to the gates of the respective transistors M1 to M4 through the resistors R3 and R4, and thus the transistors M1 to M4 are put into the off state. Further, since the inverter circuit IV1 outputs the high level voltage, the high level voltage is applied to the gates of the respective transistors M5 and M6, and thus the transistors M5 and M6 are put into an on state. Accordingly, the resistors R1 and R2, the transistors M5 to M8, and the current source I1 operate as a buffer circuit.

In this way, in the frequency dividing circuit 1B, the circuit is configured of the CML. Therefore, it is possible to perform high speed operation. As a result, even in the case where the clock signal of high frequency is input to the frequency dividing circuit 1B, it is possible to perform frequency dividing operation.

2. Second Embodiment

Next, a frequency dividing circuit 2 according to a second embodiment is described. The frequency dividing circuit 2 operates at a frequency (for example, several hundred MHz) slightly lower than that of the frequency dividing circuit 1 according to the above-described first embodiment. Incidentally, like numerals are used to designate substantially like components of the frequency dividing circuit 1 according to the above-described first embodiment, and the description thereof is appropriately omitted.

Figure 10:
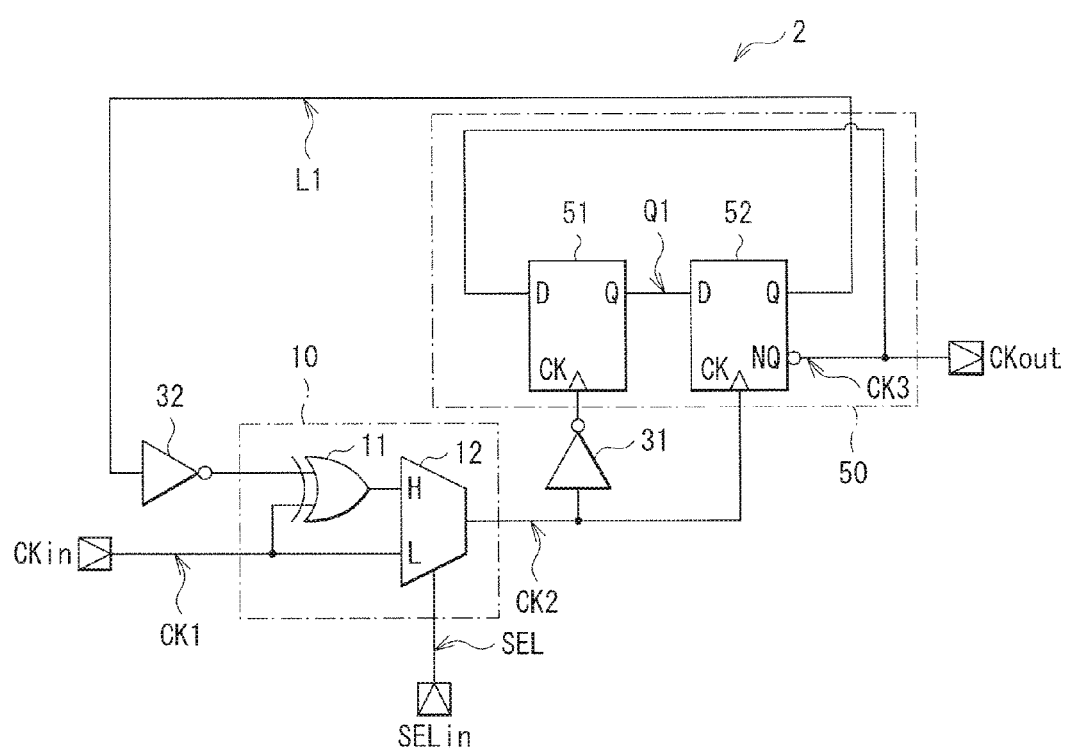
FIG. 10 is a circuit diagram illustrating a configuration example of a frequency dividing circuit according to a second embodiment.

FIG. 10 illustrates a configuration example of the frequency dividing circuit 2 according to the second embodiment. The frequency dividing circuit 2 includes a clock generation section 50. The clock generation section 50 includes flip-flop circuits 51 and 52.

The flip-flop circuit 51 is a so-called D-type flip-flop circuit. The flip-flop circuit 51 samples a signal input to an input terminal D at a rising edge of a signal input to an input terminal CK, and outputs the sampling result from an output terminal Q. The input terminal D of the flip-flop circuit 51 receives the clock signal CK3 output from an output terminal NQ of the flip-flop circuit 52 (described later), and the input terminal CK receives the output signal of the inverter circuit 31. Then, the flip-clop circuit 51 outputs the signal Q1 from the output terminal Q.

Similarly to the flip-flop circuit 51, the flip-flop circuit 52 is a so-called D-type flip-flop circuit. The flip-flop circuit 52 samples a signal input to an input terminal D at a rising edge of a signal input to an input terminal CK, and outputs the sampling result from an output terminal Q and outputs the inverted logic of the sampling result from the output terminal NQ as well. The input terminal D of the flip-flop circuit 52 receives the signal Q1, and the input terminal CK receives the signal CK2. Then, the flip-flop circuit 52 outputs the signal L1 from the output terminal Q, and outputs the clock signal CK3 from the output terminal NQ.

Here, the flip-flop circuit 51 corresponds to a specific but non-limiting example of "first sampling circuit" in the disclosure. The flip-flop circuit 52 corresponds to a specific but non-limiting example of "second sampling circuit" in the disclosure.

With this configuration, the flip-flop circuit 51 samples the clock signal CK3 at the falling edge of the signal CK2, to generate the signal Q1. In addition, the flip-flop circuit 52 samples the signal Q1 at the rising edge of the signal CK2, to generate the signal L1, and also generates the clock signal CK3 that is the inverted logic signal of the signal L1.

Even with such a circuit configuration, the frequency dividing circuit 2 is allowed to operate similarly to the frequency dividing circuit 1 according to the above-described first embodiment (FIGS. 3 and 5).

As described above, in the second embodiment, the clock generation section is configured using the two flip-flop circuits. Therefore, even in the case where the operation frequency is slightly low, it is possible to achieve the frequency dividing circuit that is capable of switching the dividing ratio between "2" and "3". Other effects are similar to those in the above-described first embodiment.

Modification 2-1

In the above-described second embodiment, the signal L1 output from the output terminal Q of the flip-flop circuit 52 is supplied to the EX-OR circuit 11 of the operation mode selection section 10 through the inverter circuit 32. However, the configuration is not limited thereto, and the clock signal CK3 output from the output terminal NQ of the flip-flop circuit 52 may be supplied to the EX-OR circuit 11 of the operation mode selection section 10, similarly to the modification 1-1.

Modification 2-2

Figure 11:
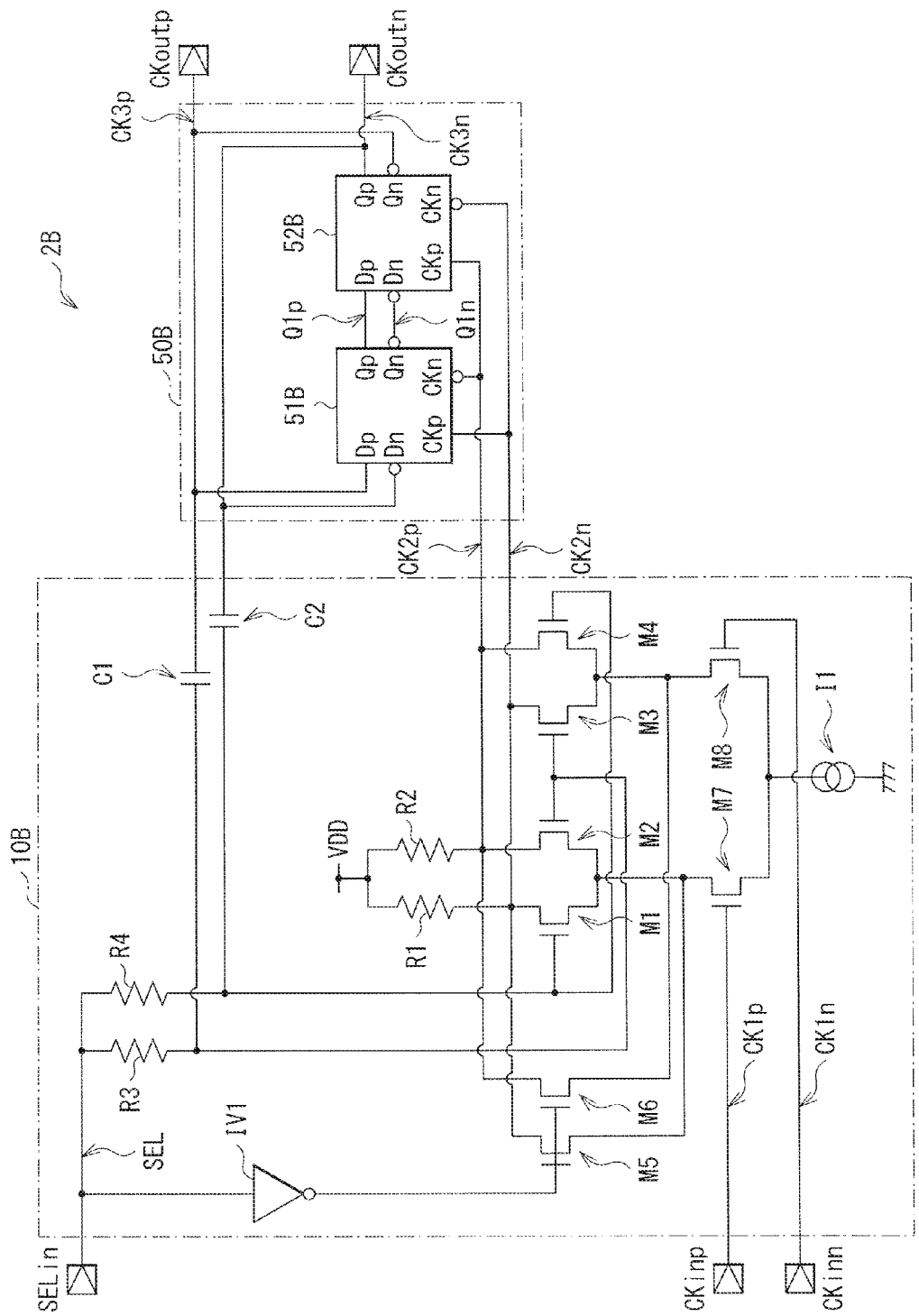
FIG. 11 is a circuit diagram illustrating a configuration example of a frequency dividing circuit according to a modification of the second embodiment.

The frequency dividing circuit 2 according to the above-described second embodiment may be configured of a circuit handling a single-ended signal such as a so-called CMOS circuit or a differential circuit handling a differential signal. FIG. 11 illustrates a configuration example of a frequency dividing circuit 2B configured of a differential circuit. The frequency dividing circuit 2B includes the operation mode selection section 10B and a clock generation section 50B. The clock generation section 50B includes flip-flop circuits 51B and 52B.

An input terminal Dp of the flip-flop circuit 51B is connected to an output terminal Qn of the flip-flop circuit 52B, the second end of the capacitor C1, and a clock output terminal CKoutp. An input terminal Dn thereof is connected to an output terminal Qp of the flip-flop circuit 52B, the second end of the capacitor C2, and a clock output terminal CKoutn. An input terminal CKp of the flip-flop circuit 51B is connected to an input terminal CKn of the flip-flop circuit 52B, the drains of the respective transistors M1, M3, and M5, and the second end of the resistor R1. An input terminal CKn thereof is connected to an input terminal CKp of the flip-flop circuit 52B, the drains of the respective transistors M2, M4, and M6, and the second end of the resistor R2. An output terminal Qp of the flip-flop circuit 51B is connected to an input terminal Dp of the flip-flop circuit 52B, and an output terminal Qn of the flip-flop circuit 51B is connected to the input terminal Dn of the flip-flop circuit 52B.

The input terminal Dp of the flip-flop circuit 52B is connected to the output terminal Qp of the flip-flop circuit 51B, and the input terminal Dn of the flip-flop circuit 52B is connected to the output terminal Qn of the flip-flop circuit 51B. The input terminal CKp of the flip-flop circuit 52B is connected to the input terminal CKn of the flip-flop circuit 51B, the drains of the respective transistors M2, M4, and M6, and the second end of the resistor R2. The input terminal CKn thereof is connected to the input terminal CKp of the flip-flop circuit 51B, the drains of the transistors M1, M3, and M5, and the second end of the resistor R1. The output terminal Qp of the flip-flop circuit 52B is connected to the input terminal Dn of the flip-flop circuit 51B, the second end of the capacitor C2, and the clock output terminal CKoutn. The output terminal Qn thereof is connected to the input terminal Dp of the flip-flop circuit 51B, the second end of the capacitor C1, and the clock output terminal CKoutp. The clock signal CK3$p$ is generated at the output terminal Qn of the flip-flop circuit 52B, and the clock signal CK3$n$ is generated at the output terminal Qp.

Figure 12:
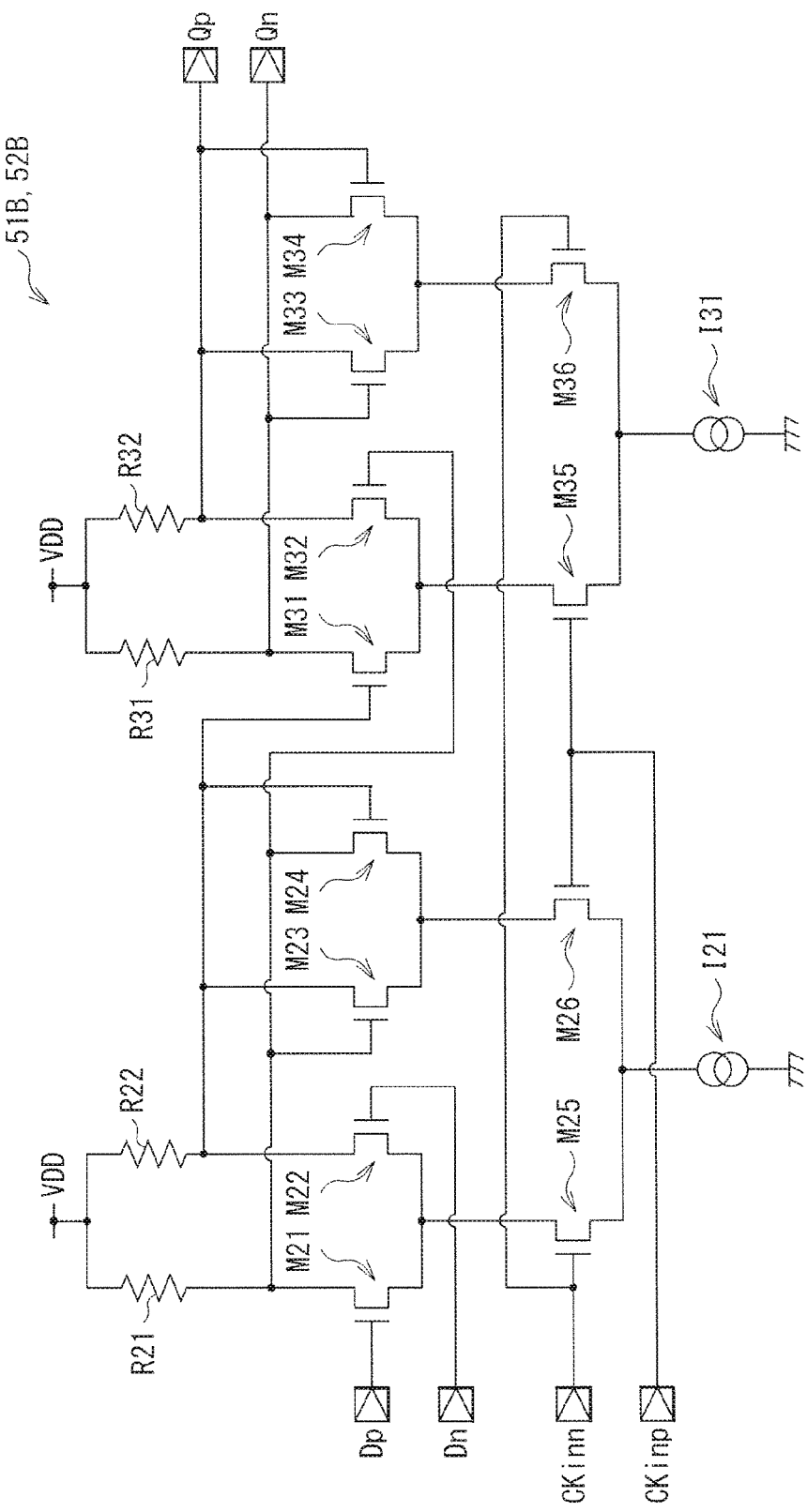
FIG. 12 is a circuit diagram illustrating a configuration example of a flip-flop circuit illustrated in FIG. 11.

FIG. 12 illustrates a configuration example of the flip-flop circuits 51B and 52B. The flip-flop circuits 51B and 52B each include resistors R21, R22, R31, and R32, transistors M21 to M26 and M31 to M36, and current sources I21 and I31.

A first end of the resistor R21 is supplied with the source voltage VDD, and a second end thereof is connected to drains of the respective transistors M21 and M24 and gates of the respective transistors M23 and M32. A first end of the resistor R22 is supplied with the source voltage VDD, and a second end thereof is connected to drains of the respective transistors M22 and M23 and gates of the respective transistors M24 and M31. A first end of the resistor R31 is supplied with the source voltage VDD, and a second end thereof is connected to drains of the respective transistors M31 and M34, a gate of the transistor M33, and the output terminal Qn. A first end of the resistor R32 is supplied with the source voltage VDD, and a second end thereof is connected to drains of the respective transistors M32 and M33, a gate of the transistor M34, and the output terminal Qp.

In this example, each of the transistors M21 to M26 and M31 to M36 is an N-channel MOSFET. The drain of the transistor M21 is connected to the second end of the resistor R21, the gates of the respective transistors M23 and M32, and the drain of the transistor M24. A gate thereof is connected to the input terminal Dp, and a source thereof is connected to a source of the transistor M22 and a drain of the transistor M25. The drain of the transistor M22 is connected to the second end of the resistor R22, the drain of the transistor M23, and the gates of the respective transistors M24 and M31. A gate thereof is connected to the input terminal Dn, and the source thereof is connected to the source of the transistor M21 and the drain of the transistor M25. The drain of the transistor M23 is connected to the second end of the resistor R22, the drain of the transistor M22, and the gates of the respective transistors M24 and M31. The gate thereof is connected to the second end of the resistor R21, the drains of the respective transistors M21 and M24, and the gate of the transistor M32. A source thereof is connected to a source of the transistor M24 and a drain of the transistor M26. The drain of the transistor M24 is connected to the second end of the resistor R21, the drain of the transistor M21, and the gates of the respective transistors M23 and M32. The gate thereof is connected to the second end of the resistor R22, the drains of the respective transistors M22 and M23, and the gate of the transistor M31. The source thereof is connected to the source of the transistor M23 and the drain of the transistor M26. The drain of the transistor M25 is connected to the sources of the respective transistors M21 and M22. A gate thereof is connected to a gate of the transistor M36 and the input terminal CKinn, and a source thereof is connected to a source of the transistor M26 and a first end of the current source I21. The drain of the transistor M26 is connected to the sources of the respective transistors M23 and M24, a gate thereof is connected to a gate of the transistor M35 and the input terminal CKinp, and the source thereof is connected to the source of the transistor M25 and the first end of the current source I21.

The drain of the transistor M31 is connected to the second end of the resistor R31, the gate of the transistor M33, the drain of the transistor M34, and the output terminal Qn. The gate thereof is connected to the second end of the resistor R22, the drains of the respective transistors M22 and M23, and the gate of the transistor M24. A source thereof is connected to a source of the transistor M32 and a drain of the transistor M35. The drain of the transistor M32 is connected to the second end of the resistor R32, the drain of the transistor M33, the gate of the transistor M34, and the output terminal Qp. The gate thereof is connected to the second end of the resistor R21, the drains of the respective transistors M21 and M24, and the gate of the transistor M23. The source thereof is connected to the source of the transistor M31 and the drain of the transistor M35. The drain of the transistor M33 is connected to the second end of the resistor R32, the drain of the transistor M32, the gate of the transistor M34, and the output terminal Qp. The gate thereof is connected to the second end of the resistor R31, the drains of the respective transistors M31 and M34, and the output terminal Qn. A source thereof is connected to a source of the transistor M34 and a drain of the transistor M36. The drain of the transistor M34 is connected to the second end of the resistor R31, the drain of the transistor M31, the gate of the transistor M33, and the output terminal Qn. The gate thereof is connected to the second end of the resistor R32, the drains of the respective transistors M32 and M33, and the output terminal Qp. The source thereof is connected to the source of the transistor M33 and the drain of the transistor M36. The drain of the transistor M35 is connected to the sources of the respective transistors M31 and M32, the gate thereof is connected to the gate of the transistor M26 and the input terminal CKinp, and a source thereof is connected to a source of the transistor M36 and a first end of the current source I31. The drain of the transistor M36 is connected to the sources of the respective transistors M33 and M34, the gate thereof is connected to the gate of the transistor M25 and the input terminal CKinn, and the source thereof is connected to the source of the transistor M35 and the first end of the current source I31.

The first end of the current source I21 is connected to the sources of the respective transistors M25 and M26, and a second end thereof is grounded. The first end of the current source I31 is connected to the sources of the respective transistors M35 and M36, and a second end thereof is grounded.

3. Application Example

Next, an application example of the frequency dividing circuit described in the above-described embodiments and modifications will be described.

Figure 13:
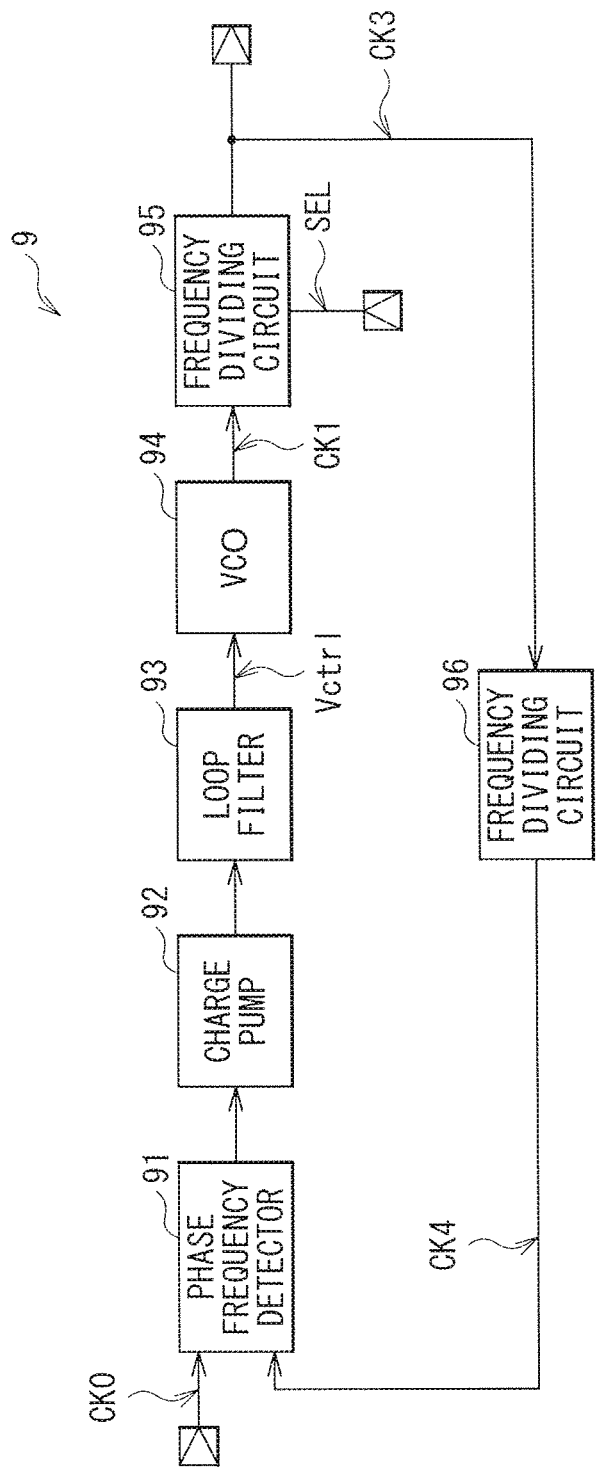
FIG. 13 is a block diagram illustrating a configuration example of a phase synchronization circuit according to an application example.

FIG. 13 illustrates a configuration example of a phase synchronization circuit 9 to which the frequency dividing circuit according to any of the above-described embodiments and the like is applied. The phase synchronization circuit 9 generates the clock signal CK3 having a higher frequency, based on a clock signal CK0, and for example, may be used in various applications such as a TV tuner. The phase synchronization circuit 9 includes a phase frequency detector (PFD) 91, a charge pump 92, a loop filter 93, a voltage controlled oscillator (VCO) 94, and frequency dividing circuits 95 and 96.

The PFD 91 compares a phase of the clock signal CK0 with a phase of a clock signal CK4, and outputs a comparison result. The charge pump 92 allows a current to flow through the loop filter 93 or sinks a current from the loop filter 93, based on the comparison result supplied from the PFD 91. The loop filter 93 converts the current signal supplied from the charge pump 92 into a voltage signal while filtering, to generate a voltage Vctrl. The VCO 94 generates the clock signal CK1 having a frequency corresponding to the voltage Vctrl. The frequency dividing circuit 95 divides the frequency of the clock signal CK1 to generate the clock signal CK3, and is configured of any of the frequency dividing circuits 1, 2, and the like according to the above-described embodiments and the like. The frequency dividing circuit 96 divides the frequency of the clock signal CK3 at a predetermined dividing ratio.

In the phase synchronization circuit 9, since the frequency dividing circuit 95 is provided in this way, it is possible to equivalently extend a variable frequency range of the VCO 94 as will be described below.

Figure 14:
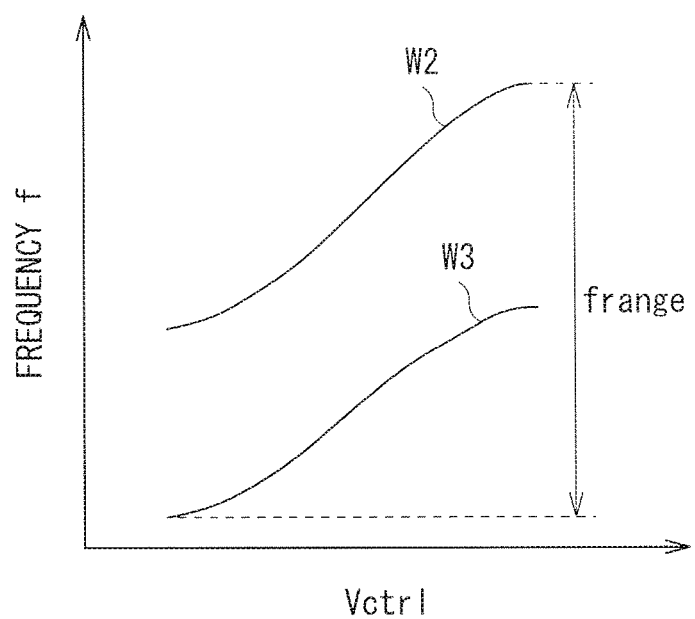
FIG. 14 is a characteristic diagram illustrating a characteristic example of the phase synchronization circuit illustrated in FIG. 13.

FIG. 14 illustrates characteristics in the VCO 94 and the frequency dividing circuit 95. In FIG. 14, a lateral axis indicates the voltage Vctrl, and a vertical axis indicates a frequency f of the output clock signal CK3 of the frequency dividing circuit 95. A characteristic W2 indicates an example in a case where the dividing ratio of the frequency dividing circuit 95 is set to "2", and a characteristic W3 indicates an example in a case where the dividing ratio of the frequency dividing circuit 95 is set to "3". In this way, since the frequency dividing circuit 95 that is capable of switching the dividing ratio is provided in the phase synchronization circuit 9, it is possible to extend a variable frequency range frange as compared with the case where such a frequency dividing circuit 95 is not provided.

Moreover, input impedance at the input terminal CKin of the frequency dividing circuit 95 is not substantially varied by the operation mode selection signal SEL. Therefore, for example, even when the VCO 94 is configured of a LC-VCO, it is possible to reduce possibility that the characteristics of the VCO 94 itself are varied by the operation mode selection signal SEL. Specifically, in LC-VCO, typically, input impedance of a circuit connected in a post stage may affect oscillation frequency characteristics. In the phase synchronization circuit 9, since the frequency dividing circuit 95 is provided, the input impedance is not substantially varied by the operation mode selection signal SEL. Therefore, it is possible to reduce possibility that the characteristics of the VCO 94 itself are varied.

Hereinbefore, the technology has been described with reference to the embodiments, the modifications, and the application example. However, the technology is not limited to the embodiments and the like, and various modifications may be made.

For example, in the differential circuit according to the modification of the above-described embodiments, the transistors M1 to M8 and the like are each configured using an N-channel MOSFET; however, the configuration is not limited thereto. Alternatively, for example, a P-channel MOSFET may be used or a bipolar transistor may be used.

Note that the effects described in the present specification are illustrative and non-limiting. Effects achieved by the technology may be effects other than those described above.

Note that the technology may be configured as follows.

(1) A frequency dividing circuit including:

a mode selection section configured to determine an exclusive OR of a first clock signal and a first signal and output the exclusive OR as a second signal in a first operation mode, and to output the first clock signal as the second signal in a second operation mode; and a clock generation section configured to generate and output a second clock signal, based on the second signal and the second clock signal, and to output one of the second clock signal and a third clock signal, as the first signal, the third clock signal having a phase same as a phase of the second clock signal.

(2) The frequency dividing circuit according to (1), wherein the clock generation section includes a first sampling circuit and a second sampling circuit, the first sampling circuit samples the second clock signal at a timing of a transition of the second signal in a first transition direction and outputs a resultant signal, and the second sampling circuit samples an output signal of the first sampling circuit at a timing of a transition of the second signal in a second transition direction, and outputs an inverted logic signal of a sampling result, as the second clock signal.

(3) The frequency dividing circuit according to (2), wherein each of the first sampling circuit and the second sampling circuit is a latch circuit.

(4) The frequency dividing circuit according to (2), wherein each of the first sampling circuit and the second sampling circuit is a flip-flop circuit.

(5) The frequency dividing circuit according to any one of (2) to (5), wherein the clock generation section includes an inverting circuit that determines an inverted logic of the sampling result to generate the third clock signal.

(6) The frequency dividing circuit according to any one of (1) to (5), wherein the mode selection section and the clock generation section are each configured as a differential circuit.

(7) The frequency dividing circuit according to (6), wherein the mode selection section includes
a first clock input terminal and a second clock input terminal that are configured to receive the first clock signal as a differential signal,
a first input terminal and a second input terminal that are configured to receive the first signal as a differential signal,
a first output terminal and a second output terminal at which the second signal appears as a differential signal,
a first resistor interposed between a first power source and the second output terminal,
a second resistor interposed between the first power source and the first output terminal,
a first capacitor interposed between the first input terminal and a first node,
a second capacitor interposed between the second input terminal and a second node,
a third resistor interposed between the first node and a third node, the third node being supplied with a voltage corresponding to the operation mode,
a fourth resistor interposed between the second node and the third node,
a first transistor interposed between the second output terminal and a fourth node and configured to be turned on or off based on a voltage at the second node,
a second transistor interposed between the first output terminal and the fourth node and configured to be turned on or off based on a voltage at the first node,
a third transistor interposed between the second output terminal and a fifth node and configured to be turned on or off based on the voltage of the first node,
a fourth transistor interposed between the first output terminal and the fifth node and configured to be turned on or off based on the voltage at the second node,
a fifth transistor interposed between the second output terminal and the fourth node and configured to be turned off in the first operation mode and to be turned on in the second operation mode,
a sixth transistor interposed between the first output terminal and the fifth node and configured to be turned off in the first operation mode and to be turned on in the second operation mode,
a seventh transistor interposed between the fourth node and a sixth node and configured to be turned on or off based on a voltage at the first clock input terminal,
a eighth transistor interposed between the fifth node and the sixth node and configured to be turned on or off based on a voltage at the second clock input terminal, and
a current source interposed between the sixth node and a second power source.

(8) A phase synchronization circuit including:
a phase frequency detector configured to compare a phase of an input clock signal with a phase of a feedback clock signal;
an oscillation circuit configured to generate a first clock signal based on a comparison result of the phase frequency detector;
a first frequency dividing circuit configured to divide a frequency of the first clock signal to generate a second clock signal; and
a second frequency dividing circuit configured to divide a frequency of the second clock signal to generate the feedback clock signal, wherein
the first frequency dividing circuit includes
a mode selection section configured to determine an exclusive OR of the first clock signal and a first signal and output the exclusive OR as a second signal in a first operation mode, and to output the first clock signal as the second signal in a second operation mode, and
a clock generation section configured to generate and output the second clock signal, based on the second signal and the second clock signal, and to output one of the second clock signal and a third clock signal, as the first signal, the third clock signal having a phase same as a phase of the second clock signal.

It should be understood by those skilled in the art that various modifications, combinations, sub-combinations, and alterations may occur depending on design requirements and other factors insofar as they are within the scope of the appended claims or the equivalents thereof.

What is claimed is:

1. A frequency dividing circuit comprising:
a mode selection section configured to determine an exclusive OR of a first clock signal and a first signal and output the exclusive OR as a second signal in a first operation mode, and to output the first clock signal as the second signal in a second operation mode; and
a clock generation section configured to generate and output a second clock signal, based on the second signal and the second clock signal, and to output one of the second clock signal and a third clock signal, as the first signal, the third clock signal having a phase same as a phase of the second clock signal.

2. The frequency dividing circuit according to claim 1, wherein
the clock generation section includes a first sampling circuit and a second sampling circuit,
the first sampling circuit samples the second clock signal at a timing of a transition of the second signal in a first transition direction and outputs a resultant signal, and
the second sampling circuit samples an output signal of the first sampling circuit at a timing of a transition of the second signal in a second transition direction, and outputs an inverted logic signal of a sampling result, as the second clock signal.

3. The frequency dividing circuit according to claim 2, wherein each of the first sampling circuit and the second sampling circuit is a latch circuit.

4. The frequency dividing circuit according to claim 2, wherein each of the first sampling circuit and the second sampling circuit is a flip-flop circuit.

5. The frequency dividing circuit according to claim 2, wherein the clock generation section includes an inverting circuit that determines an inverted logic of the sampling result to generate the third clock signal.

6. The frequency dividing circuit according to claim 1, wherein the mode selection section and the clock generation section are each configured as a differential circuit.

7. The frequency dividing circuit according to claim 6, wherein the mode selection section includes
- a first clock input terminal and a second clock input terminal that are configured to receive the first clock signal as a differential signal,
- a first input terminal and a second input terminal that are configured to receive the first signal as a differential signal,
- a first output terminal and a second output terminal at which the second signal appears as a differential signal,
- a first resistor interposed between a first power source and the second output terminal,
- a second resistor interposed between the first power source and the first output terminal,
- a first capacitor interposed between the first input terminal and a first node,
- a second capacitor interposed between the second input terminal and a second node,
- a third resistor interposed between the first node and a third node, the third node being supplied with a voltage corresponding to the operation mode,
- a fourth resistor interposed between the second node and the third node,
- a first transistor interposed between the second output terminal and a fourth node and configured to be turned on or off based on a voltage at the second node,
- a second transistor interposed between the first output terminal and the fourth node and configured to be turned on or off based on a voltage at the first node,
- a third transistor interposed between the second output terminal and a fifth node and configured to be turned on or off based on the voltage of the first node,
- a fourth transistor interposed between the first output terminal and the fifth node and configured to be turned on or off based on the voltage at the second node,
- a fifth transistor interposed between the second output terminal and the fourth node and configured to be turned off in the first operation mode and to be turned on in the second operation mode,
- a sixth transistor interposed between the first output terminal and the fifth node and configured to be turned off in the first operation mode and to be turned on in the second operation mode,
- a seventh transistor interposed between the fourth node and a sixth node and configured to be turned on or off based on a voltage at the first clock input terminal,
- a eighth transistor interposed between the fifth node and the sixth node and configured to be turned on or off based on a voltage at the second clock input terminal, and
- a current source interposed between the sixth node and a second power source.

8. A phase synchronization circuit comprising:
- a phase frequency detector configured to compare a phase of an input clock signal with a phase of a feedback clock signal;
- an oscillation circuit configured to generate a first clock signal based on a comparison result of the phase frequency detector;
- a first frequency dividing circuit configured to divide a frequency of the first clock signal to generate a second clock signal; and
- a second frequency dividing circuit configured to divide a frequency of the second clock signal to generate the feedback clock signal, wherein
the first frequency dividing circuit includes
a mode selection section configured to determine an exclusive OR of the first clock signal and a first signal and output the exclusive OR as a second signal in a first operation mode, and to output the first clock signal as the second signal in a second operation mode, and
a clock generation section configured to generate and output the second clock signal, based on the second signal and the second clock signal, and to output one of the second clock signal and a third clock signal, as the first signal, the third clock signal having a phase same as a phase of the second clock signal.

* * * * *